United States Patent [19]

Tanaka et al.

[11] Patent Number: 4,678,932
[45] Date of Patent: Jul. 7, 1987

[54] SNUBBER CIRCUIT FOR GTO THYRISTOR

[75] Inventors: Minoru Tanaka; Yuzuru Yonehata, both of Hyogo, Japan

[73] Assignee: Mitsubishi Denki Kabushiki Kaisha, Tokyo, Japan

[21] Appl. No.: 857,049

[22] Filed: Apr. 29, 1986

[30] Foreign Application Priority Data

Apr. 30, 1985 [JP] Japan .................................. 60-92710

[51] Int. Cl.$^4$ ........................................... H03K 17/72
[52] U.S. Cl. ..................................... 307/633; 307/305
[58] Field of Search ........... 307/252 C, 252 J, 252 M, 307/305

[56] References Cited

U.S. PATENT DOCUMENTS

| 3,299,297 | 1/1967 | Motto, Jr. ....................... 307/252 C |
| 3,532,901 | 10/1970 | Cavallius et al. . |
| 3,641,364 | 2/1972 | Rippel ............................. 307/252 J |
| 4,392,175 | 7/1983 | Takigami et al. ............... 307/252 C |

FOREIGN PATENT DOCUMENTS

| 0165028 | 12/1980 | Japan ............................. 307/252 C |
| 57-81727 | 5/1982 | Japan . |
| 59-35561 | 2/1984 | Japan . |
| 60-57720 | 4/1985 | Japan . |

OTHER PUBLICATIONS

Ohashi, "Snubber Circuit for High-Power Gate Turn-Off Thyristors", Jul.-Aug., 1983, pp. 655-664.
Mitsubishi Denki Giho, "Application of GTO in Vehicle Propelling Control System", vol. 58, No. 12, 1984.
IPEC Tokyo, "Computation Method", International Power Electronics Conference, Conference Record, vol. 1, pp. 76-77; Mar. 1983.

Primary Examiner—John Zazworsky
Attorney, Agent, or Firm—Bernard, Rothwell & Brown

[57] ABSTRACT

A snubber circuit for a GTO thyristor including a series-connected member of a capacitor and a diode connected in parallel with a GTO thyristor and a series-connected member of a resistor and a thyristor connected in parallel with the diode. The thyristor is adapted to be turned on when the GTO thyristor is turned on and the thyristor is adapted to be turned off at the same time as or immediately after a turn off of the GTO thyristor, whereby the circuit is enabled to perform the same protecting function as that of a snubber circuit for a GTO thyristor which includes no thyristor and, further, to block a discharging current from the capacitor due to the ripple voltages produced across the GTO thyristor after its turn off, by means of the thyristor which is less then in an off state, so that no current may flow through the resistor.

4 Claims, 2 Drawing Figures

SNUBBER CIRCUIT FOR GTO THYRISTOR

BACKGROUND OF THE INVENTION

1. Field of the Invention

The present invention relates to a snubber circuit for a GTO thyristor and more particularly to the snubber circuit for the GTO thyristor adapted so as to eliminate the heat loss caused in a snubber resistor in the snubber circuit for the GTO thyristor due to the ripple voltages to be produced between the anode and cathode of the GTO thyristor when the GTO thyristor has been turned off.

2. Description of the Prior Art

FIG. 1 is a circuit diagram showing a GTO snubber circuit of the prior art, wherein 1 denotes a GTO thyristor (hereinafter abbreviated as GTO), 2 denotes a snubber diode, 3 denotes a snubber capacitor, 4 denotes a snubber resistor, A denotes the anode of the GTO 1, and K denotes the cathode of the GTO 1. The capacitor 3 and the diode 2 are connected in series and this series connection is connected in parallel with the GTO 1, and, the resistor 4 is connected in parallel with the diode 2. And, the forward direction, i.e., the directions from the anode A toward the cathode K, of the GTO 1 is arranged in the same direction as the forward direction of the diode 2.

Operations of the above mentioned circuit will be described in the following. When a conducting GTO 1 is turned off, the current is commutated to the snubber circuit to pass through the capacitor 3 and the diode 2, whereby the capacitor 3 is charged. At this time, the terminal voltage of the capacitor 3, substantially as it is, is applied between the anode A and cathode K of the GTO 1. The turn-off voltage build-up rate of the voltage produced at this turn-off depends on the value of the current as well as the capacitance of the capacitor 3. In order to protect the GTO 1, the snubber circuit must have a capacity to sufficiently absorb the change in the voltage waveform produced at the time the GTO 1 is turned off, and the turn-off voltage build-up rate must be kept down. Therefore, when a large current flowing through the GTO 1 is to be turned off, the capacitor 3 must be provided with a large capacitance.

When the GTO 1 is turned on, on the other hand, the discharging current from the capacitor 3 takes a value that is limited by the resistor 4, whereby an excessive current is prevented from flowing through the GTO 1. At this time the resistor 4 dissipates in the form of heat energy the energy of the electrical charges on the capacitor 3.

And, in the event of the forward voltage between the anode A and the cathode K becoming high due to occurrence of the ripple voltages or the like at the time the GTO 1 has been turned off, the resulting current will charge the snubber capacitor 3 through the diode 2, and as the anode A — cathode K forward voltage decreases, the electrical charges on the capacitor 3 will be discharged through the resistor 4.

Since the snubber circuit for a GTO thyristor of the prior art was of the above described structure, it was required to install a capacitor of a large capacitance for a large current system. Further, in the case where the ripple voltage between the anode and the cathode of the GTO was high at the turn off of the GTO, the resistor produced large heat during the discharging period of the capacitor. When the ripple voltage and the frequency were both high, in particular, the heat loss in the resistor was very large, and therefore, the resistor had to be made in a large form, and, as a result, the external form of the apparatus including the circuit occupied a large space.

SUMMARY OF THE INVENTION

An object of the present invention is the provision of an effective snubber circuit for a GTO thyristor in which the above mentioned difficulties in the prior art apparatus are overcome.

Another object of the present invention is the provision of a snubber circuit for a GTO thyristor which will operate in the same manner as the prior art apparatus thereby to protect the GTO at its turn on and turn off, which will eliminate the heat loss in the resistor due to the anode-cathode voltage changing at the time of the turn off, and which will enable a resistor of small size to be employed.

Other objects and advantages of the present invention will be made more apparent from the following detailed description of the embodiment taken in conjunction with the accompanying drawings.

PREFERRED EMBODIMENT OF THE INVENTION

Figure 1:
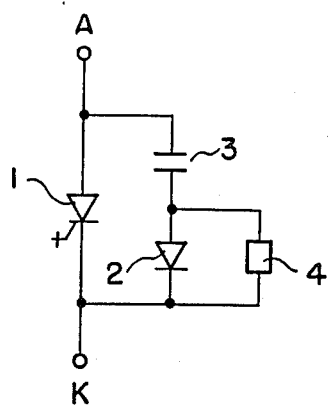
FIG. 1 is a circuit diagram showing a prior art GTO thyristor snubber circuit.
Figure 2:
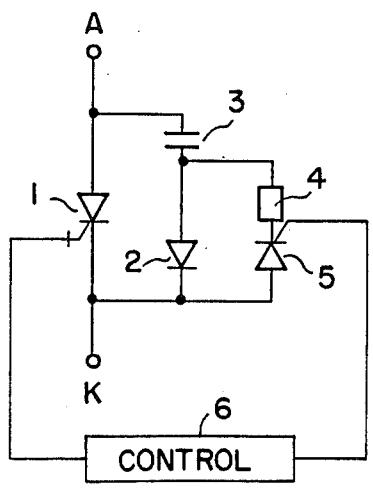
FIG. 2 is a circuit diagram showing a GTO thyristor snubber circuit according to one embodiment of the present invention.

A preferred embodiment of the invention will be described below with reference to the drawing. In FIG. 2, 1 denotes a GTO thyristor, 2 denotes a diode, 3 denotes a capacitor, 4 denotes a resistor of a relatively small current capacity and of a small size, A and K denote the anode terminal and the cathode terminal of the GTO 1, respectively, and 5 denotes a thyristor of a relatively small capacity and of a small size. The resistor 4 and the thyristor 5 are connected in series and this series-connected member is connected in parallel with the diode 2, wherein the forward direction of the diode 2 and the anode-cathode forward direction of the thyristor 5 are arranged in the reverse directions to each other. Since construction of the circuit in other respects is the same as the prior art snubber circuit, description thereof is omitted here.

Operations of the GTO snubber circuit according to this invention will be described in the following. Here, it is adapted such that, by means of control means 6, a gate signal to turn on the thyristor 5 is issued immediately before or simultaneously with a gate signal for the GTO 1 becoming an ON command and the same is withdrawn simultaneously with or immediately after the gate signal for the GTO 1 becoming an OFF command.

The present circuit operates the same as the prior art snubber circuit because the thyristor 5 turns on and off as the GTO 1 turns on and off. Namely, simultaneously with or immediately after the turn off of the GTO 1, there is no longer a gate signal provided for the thyristor 5 to keep the thyristor 5 in the ON state, and so, the thyristor 5 is turned off and blocks the current passing therethrough. Therefore, even if ripple voltages are produced between the anode A and the cathode K upon the turning off of the GTO 1, since then the thyristor 5 is in the OFF state, electrical charges on the capacitor 3 will not be discharged through the resistor 4. Thus, there is not produced any heat loss in the resistor 4 and therefore the resistor 4 can be of a small capacity. And, as to the thyristor 5, it only passes therethrough the discharging current from the capacitor 3 limited by the resistor 4 for a short while upon the turning on of the GTO 1, and the voltage then impressed on the thyristor 5 is of a small value, i.e. the difference voltage between the charging voltage on the capacitor 3 and the anode A— cathode K voltage of the GTO 1. Therefore, it also can be of a small capacity and a small size in external form.

Although a GTO system capable of conducting a current only in one direction was described in the foregoing, the snubber circuit of the present invention is also applicable, with equal effects, to other systems such as one in which two GTO thyristors and two diodes, respectively, are connected in parallel with the forward directions thereof arranged in the reverse directions, or one in which two GTO circuits, having the same snubber circuit as described above, are connected in parallel with the forward directions of their GTO thyristors arranged in the reverse directions.

As a matter of course, even if a plurality of GTO thyristors are arranged in a series-parallel connection, like effects can be obtained by providing each the GTO thyristor with the snubber circuit according to the present invention.

As described in the foregoing, the present invention has been structured such that, even if high ripple voltages are produced between the anode and the cathode upon the turn off of the GTO thyristor, the discharging current from the capacitor through the resistor is blocked by the thyristor. Therefore, such effects are obtained that the thyristor used in the snubber circuit can serve the purpose with a small capacity and size, the resistor can be made in a small external form, and the apparatus including the circuit can be made to occupy only little space.

What is claimed is:

1. A snubber circuit for a GTO thyristor comprising a series-connected member of a capacitor and a diode connected in parallel with a GTO thyristor and a series-connected member of a resistor and a thyristor connected in parallel with said diode.

2. A snubber circuit for a GTO thyristor according to claim 1, wherein said diode and said thyristor are connected such that the forward direction of said GTO thyristor and the forward direction of said diode are arranged in the same direction and the forward direction of said diode and the forward direction of said thyristor are arranged in the reverse directions.

3. A snubber circuit for a GTO thyristor according to claim 1, including control means for controlling the gate of said GTO thyristor and the gate of said thyristor to operate in synchronism with each other.

4. A snubber circuit for a GTO thyristor according to claim 2, including control means for controlling the gate of said GTO thyristor and the gate of said thyristor to operate in synchronism with each other.

* * * * *